United States Patent
Plants et al.

[11] Patent Number: 5,952,847
[45] Date of Patent: Sep. 14, 1999

[54] MULTIPLE LOGIC FAMILY COMPATIBLE OUTPUT DRIVER

[75] Inventors: William C. Plants, Santa Clara; Gregory W. Bakker, San Jose, both of Calif.

[73] Assignee: Actel Corporation, Sunnyvale, Calif.

[21] Appl. No.: 08/673,701

[22] Filed: Jun. 25, 1996

[51] Int. Cl.$^6$ ............................................. H03K 19/0185
[52] U.S. Cl. .............................. 326/80; 326/58; 326/81; 326/83
[58] Field of Search .................. 326/63, 80, 81, 326/119, 121, 57–58, 83, 86, 68

[56] References Cited

U.S. PATENT DOCUMENTS

| | | | |
|---|---|---|---|
| 4,638,187 | 1/1987 | Boler et al. | 307/451 |
| 4,684,830 | 8/1987 | Tsui et al. | 307/465 |
| 4,700,130 | 10/1987 | Bloemen | 324/110 |
| 4,706,216 | 11/1987 | Carter | 365/94 |
| 4,713,557 | 12/1987 | Carter | 307/242 |
| 4,717,912 | 1/1988 | Harvey et al. | 340/825 |
| 4,742,252 | 5/1988 | Agrawal | 307/465 |
| 4,772,812 | 9/1988 | Desmarais | 326/17 |
| 4,857,774 | 8/1989 | El-Ayat et al. | 307/465 |
| 4,870,300 | 9/1989 | Nakaya et al. | 307/303 |
| 4,870,302 | 9/1989 | Freeman | 307/465 |
| 4,873,459 | 10/1989 | El Gamal et al. | 307/465 |
| 4,928,023 | 5/1990 | Marshall | 307/443 |
| 4,959,561 | 9/1990 | McDermott et al. | 307/443 |
| 4,978,905 | 12/1990 | Hoff et al. | 323/314 |
| 5,046,035 | 9/1991 | Jigour et al. | 364/716 |
| 5,083,083 | 1/1992 | El-Ayat et al. | 324/158 |

(List continued on next page.)

OTHER PUBLICATIONS

"ASIC Vendors Round Out Transition Paths from 5–V to 3–V Systems", Feb. 1994, Computer Design's ASIC Design, p. A8.

"H4CplusTM Series CMOS Arrays with Mixed 3.3V/5.0V Levels", 1992, Motorola.

"ISSCC 92 Session 6/Microprocessors/Paper TA 6.2", 1992, IEEE International Solid–State Circuits Conference, pp. 106–107.

Smith, Daniel E. "Using the iFX780 FPGA in Hybrid 3.3V/5V Systems", Sep. 1992, Intel Application Brief, pp. 1–7.

"Tips for Straddling the 3–V to 5–V Fence", Apr. 4, 1994, Electronic Design.

Wahlstrom, et al., "An 11000–Fuse Electrically Erasable Programmable Logic Device (EEPLD) with an Extended Macrocell", 1988, IEEE, pp. 916–922.

Primary Examiner—Jon Santamauro
Attorney, Agent, or Firm—D'Alessandro & Ritchie

[57] ABSTRACT

The output buffer circuit according to the present invention is connected to an I/O pad of the integrated circuit. The output buffer circuit includes an output totem pole, a level shifter and enable logic. The output totem pole has a first input connected to the level shifter and a second input connected to the enable logic. The output of the totem pole is connected to an I/O pad. The totem pole includes a pullup transistor connected to 3.3 volt Vcc and a pulldown transistor connected to ground. In a first embodiment of the invention, the pullup transistor in the totem pole is an N-channel MOS transistor, and in a second embodiment of the invention, the pullup transistor in the totem pole is a P-channel MOS transistor formed in an N-well tied to the 5 volt Vcc. In the first embodiment of the present invention, the N-Channel MOS pullup transistor is turned on by a 5 volt signal from the level shifter. In the second embodiment of the present invention, the P-Channel MOS pullup transistor is turned on by a ground level signal from the level shifter. The enable logic drives the output of the totem pole in response to input signals to the enable logic. The inputs to the enable logic are a Data input, a Global enable input and an Output enable input.

8 Claims, 2 Drawing Sheets

U.S. PATENT DOCUMENTS

| | | | |
|---|---|---|---|
| 5,121,394 | 6/1992 | Russell | 371/22.1 |
| 5,122,685 | 6/1992 | Chan et al. | 307/465 |
| 5,132,571 | 7/1992 | McCollum et al. | 307/465 |
| 5,144,166 | 9/1992 | Camarota et al. | 307/465 |
| 5,208,491 | 5/1993 | Ebeling et al. | 307/465 |
| 5,220,213 | 6/1993 | Chan et al. | 307/465 |
| 5,220,215 | 6/1993 | Douglas et al. | 307/465 |
| 5,221,865 | 6/1993 | Phillips et al. | 307/465 |
| 5,258,319 | 11/1993 | Inuishi et al. | 437/35 |
| 5,286,992 | 2/1994 | Ahrens et al. | 257/356 |
| 5,300,830 | 4/1994 | Hawes | 326/39 |
| 5,300,832 | 4/1994 | Rogers | 326/68 |
| 5,317,698 | 5/1994 | Chan | 395/325 |
| 5,394,034 | 2/1995 | Becker et al. | 326/39 |
| 5,396,128 | 3/1995 | Dunning et al. | 326/80 X |
| 5,399,920 | 3/1995 | Van Tran | 326/83 |
| 5,400,262 | 3/1995 | Mohsen | 364/489 |
| 5,430,335 | 7/1995 | Tanoi | 327/170 |
| 5,473,268 | 12/1995 | Declercq et al. | 326/80 |
| 5,546,019 | 8/1996 | Liao | 326/81 |
| 5,559,464 | 9/1996 | Orii et al. | 326/80 |
| 5,670,905 | 9/1997 | Keeth et al. | 326/81 |

MULTIPLE LOGIC FAMILY COMPATIBLE OUTPUT DRIVER

BACKGROUND OF THE INVENTION

1. Field of the Invention

The present invention relates to electronic circuitry for integrated circuits. More particularly, the present invention relates to an output buffer circuit which can drive devices from multiple logic families having different voltages representing logic levels.

2. The Prior Art

With recent progress in integrated circuit technology, ICs with logic operating from a Vcc of 3.3 volts have become available. This has caused a shift from the 5 volt Vcc standard used in TTL and CMOS circuits to a Vcc of 3.3 volts which may be used for low voltage TTL and CMOS circuits. The use of both a 5 volt Vcc and a 3.3 volt Vcc in the same overall system circuit design has created difficulties for both system and IC designers. When IC designers design a circuit to interface with other circuits having a Vcc of only either 5 volts or 3.3 volts, problems arise when a circuit designed for a Vcc of 3.3 volts must interface with a circuit designed for a Vcc of 5 volts.

For example, in a hybrid system including both a Vcc of 3.3 volts and a Vcc of 5 volts, the output of a device with a Vcc of 5 volts may be connected to a common node to which is also connected the output of a device having a Vcc of 3.3 volts. A CMOS output buffer of a device with a Vcc of 3.3 volts may typically include a totem pole output for driving the output node. The CMOS totem pole typically includes a P-channel MOS pullup transistor with its source connected to a 3.3 volt Vcc, and an N-Channel MOS pulldown transistor with its source connected to ground, wherein the drains of both the P-channel MOS pullup transistor and the N-Channel MOS pulldown transistor are connected to form the output node of the output buffer. The totem pole output node may typically be connected to a common node in the system.

When a device with a Vcc of 5 volts connected to a common node drives the common node to 5 volts, the P-type drain region of the P-channel MOS pullup transistor in a totem pole also connected to the common node will be pulled above the 3.3 volt Vcc connected to the source of the P-channel MOS pullup transistor in the totem pole. As a result, the junction diode formed by the P-type drain region and the N-well in which the P-channel MOS pullup transistor is formed may become forward biased or the P-channel MOS pullup transistor may be turned on. Either of these occurrences can clamp the common node to the 3.3 volt Vcc of the 3.3 volt device and sink current. If the devices remain in this state, which is quite likely during normal use, a great deal of current will flow from the device with a Vcc of 5 volts to the device with the Vcc of 3.3 volts. This is not only a considerable waste of power, but also has the potential to damage or destroy one or both of the devices.

Several solutions for this problem have been suggested by the prior art. In programmable logic devices (PLD) which typically comprise several configurable function blocks used to implement various logic functions, wherein each configurable function block has a set of I/O buffers which are used to connect the configurable function block to I/O pins, one approach has been to provide a dedicated Vcco pin to the I/O buffers to provide the desired Vcc of either 5 volts or 3.3 volts to each of the I/O buffers in the same configurable logic block. This sets each of the pins (I/O buffers) in the same configurable function block to the desired output voltage.

This approach has several drawbacks. First, the Vcco pins to each of the configurable function blocks use pins which would otherwise be available as additional user I/O pins. Second, it increases the Vcc noise on the chip. Third, it greatly reduces the ability to interconnect the configurable function blocks internally due to constraints on pin locations.

Another approach has been to use specialized integrated circuits designed to interface between logic families. These specialized integrated circuits are known as external translators. They can be either unidirectional or bidirectional. These devices have several drawbacks which may include additional component count, use of valuable board area, higher power consumption (especially for wide busses), a high degree of design complexity, and propagation delay which precludes their use in high performance applications.

Another approach has been to modify the typical CMOS totem pole by floating the N-well in which the P-channel MOS pullup transistor is formed. The N-well is said to float, because rather than have the N-well tied to the Vcc of 3.3 volts, it is indirectly connected to the common node such that when the common node is driven above Vcc, the N-well will follow or float up with the common node, and when the common node is driven below Vcc, the N-well will not float low with the common node. There are several approaches in the prior art to implement a floating N-well.

Dobberpuhl et al., 1992 IEEE International Solid-State Circuits Conference pgs. 106–107, disclose an array of P-Channel transistors used to enable the N-well to float. This approach is not very desirable, however, because it is very vulnerable to latch-up.

Martin, Electronic Design, Apr. 4, 1994, pgs. 67–73 discloses an output scheme using Schottky clamps to implement a floating N-well. The N-well will float because the Schottky diode turn-on voltage is less than the junction diode turn-on voltage of the P-Channel MOS transistor drain region and the turn-on voltage of the P-Channel MOS transistor. This approach is also less than desirable because expensive additional processing is required, and it is also vulnerable to latch-up.

Those of ordinary skill in the art will also realize that while the problem is presently directed to systems having both a device with a Vcc of 5 volts and a device with a Vcc of 3.3 volts, that in the future, further reductions in the operating Vcc of integrated circuits will occur. Accordingly, a general solution to driving devices having different Vcc voltages is required.

It is therefore an object of the present invention to implement an output buffer circuit capable of driving devices from multiple logic families having different Vcc voltage requirements.

Another object of the present invention is to provide a totem pole in an output buffer having a pullup transistor which will not turn on or whose junction diode will not turn on when the output node is driven to a voltage above the Vcc voltage connected to the pullup transistor.

Yet another object of the present invention is to provide an output buffer which does not require a separate pin to program its output voltage level on a pin-by-pin or block-by-block basis.

It is a further object of the present invention to provide an output buffer for a programmable logic device that does not constrain the pin-to-pin connections of the programmable logic device.

It is another object of the present invention to provide a totem pole in an output buffer which is resistant to latch-up.

It is yet another object of the present invention to provide an integrated circuit supplied with a first Vcc having an output buffer with totem pole having a N-channel MOS pullup transistor connected to the first Vcc and an N-channel MOS pulldown transistor connected to ground, and an output node capable of being connected to a common node which may be driven by a device having a second Vcc without sinking current through the N-channel MOS pullup transistor, wherein the second Vcc has a higher voltage than the first Vcc.

It is a further object of the present invention to provide an integrated circuit supplied with a Vcc of 3.3 volts having an output buffer with totem pole having a N-channel MOS pullup transistor connected to a Vcc of 3.3 volts and an N-channel MOS pulldown transistor connected to ground, and an output node capable of being connected to a common node which may be driven to a 5 volts without sinking current through the N-channel MOS pullup transistor.

It is a further object of the present invention to provide a first integrated circuit supplied with a first Vcc having an output buffer a with totem pole having a P-channel MOS pullup transistor disposed in an N-well connected to a second Vcc and an N-channel MOS pulldown transistor, and an output node capable of being connected through a common node to a second integrated circuit supplied with a third Vcc, wherein the third Vcc is higher than the first Vcc, the P-channel MOS pullup transistor does not sink current when the common node is driven to a voltage higher than the first Vcc by the second integrated circuit, and the second Vcc is at least as high as the voltage to which the common node may be driven by the second integrated circuit.

Another object of the present invention is to provide an output totem pole having a P-channel MOS pullup transistor connected to a Vcc of 3.3 volts disposed in an N-well connected to a Vcc of 5 volts and an N-channel MOS pulldown transistor connected to ground, and an output node capable of being connected to a common node which may be driven to 5 volts without sinking current through the P-channel MOS pullup transistor.

BRIEF DESCRIPTION OF THE INVENTION

According to a first embodiment of the present invention, an output buffer circuit is capable of driving devices from multiple logic families having differing Vcc voltage requirements. The output buffer circuit according to the present invention is connected to an I/O pad of the integrated circuit. The output buffer circuit includes an output totem pole, a level shifter and enable logic.

The Vcc supplied to the totem pole is preferably 3.3 volts, the Vcc supplied to the level shifter is preferably 5 volts, and the Vcc supplied to the enable logic block is preferably 3.3 volts.

The totem pole has a first input connected to the level shifter and a second input connected to the enable logic. The output of the totem pole is connected to an I/O pad. The totem pole includes a pullup transistor connected to a Vcc of 3.3 volts and a pulldown transistor connected to ground. The output of the totem pole is HIGH when the pullup transistor is turned on, LOW when the pulldown transistor is turned on, and is at a high impedance state when both the pullup and pulldown transistors are turned off. The pullup transistor in the totem pole is turned on and off by a signal from the enable logic through the level shifter to the first input of the totem pole. The pulldown transistor in the totem pole is turned on and off by a signal directly from the enable logic to the second input of the totem pole.

In a first embodiment of the invention, the pullup transistor in the totem pole is an N-channel MOS transistor, and in a second embodiment of the invention, the pullup transistor in the totem pole is a P-channel MOS transistor formed in an N-well tied to the Vcc of 5 volts.

The enable logic forces the output of the totem pole to either a LOW logic level, a HIGH logic level or a high impedance state in response to input signals to the enable logic. The inputs to the enable logic are a Data input, a Global enable input and an Output enable input. The Global enable input responds to a global output select signal which is transmitted to each of the output buffer circuits simultaneously, and the Output enable input responds to an individual output buffer select signal. The use of Global enable inputs and Output enable inputs in output buffer circuits is well known to those of ordinary skill in the art. A HIGH signal presented to both the Global enable input and the Output enable input will cause the output of the totem pole to be HIGH when the signal to the Data input is HIGH, and will cause the output of the totem pole to be LOW when the signal to Data input is LOW. When a LOW signal is presented to either the Global enable input or the Output enable input, the output of the totem pole will be in a high impedance state.

In the first embodiment of the present invention, the N-Channel MOS pullup transistor is turned on by a 5 volt signal from the level shifter. In the second embodiment of the present invention, the P-Channel MOS pullup transistor is turned on by a ground level signal from the level shifter.

In the level shifter there are first and second P-Channel MOS cross-coupled transistor having gate oxide rated for 5 voltage operation, and first and second N-channel MOS transistors which are low voltage gate offset MOS transistors that differ from conventional low voltage MOS transistors by having a longer channel under the gate oxide, a lightly doped drain region, and a more heavily doped drain region in the same area as the lightly doped drain region, but offset from the gate. The pullup and pulldown transistors in the totem pole in both embodiments are also low voltage gate offset MOS transistors.

DETAILED DESCRIPTION OF PREFERRED EMBODIMENTS

Those of ordinary skill in the art will realize that the following description of the present invention is illustrative only and not in any way limiting. Other embodiments of the invention will readily suggest themselves to such skilled persons.

The output buffer circuit according to the present invention permits direct pin-to-pin connections between integrated circuits of different logic circuit families having different Vcc and output levels. For example, the output buffer circuit of the present invention may be used to drive 3.3 volt Vcc logic families such as low voltage TTL and 3.3 volt Vcc CMOS which are connected through a common node to 5 volt logic family such as TTL. It should be appreciated by those of ordinary skill in the art that the present invention is not limited to interfacing 3.3 volt Vcc and 5 volt Vcc devices, but may be used generally with logic circuit families having different Vcc and output levels.

Figure 1:
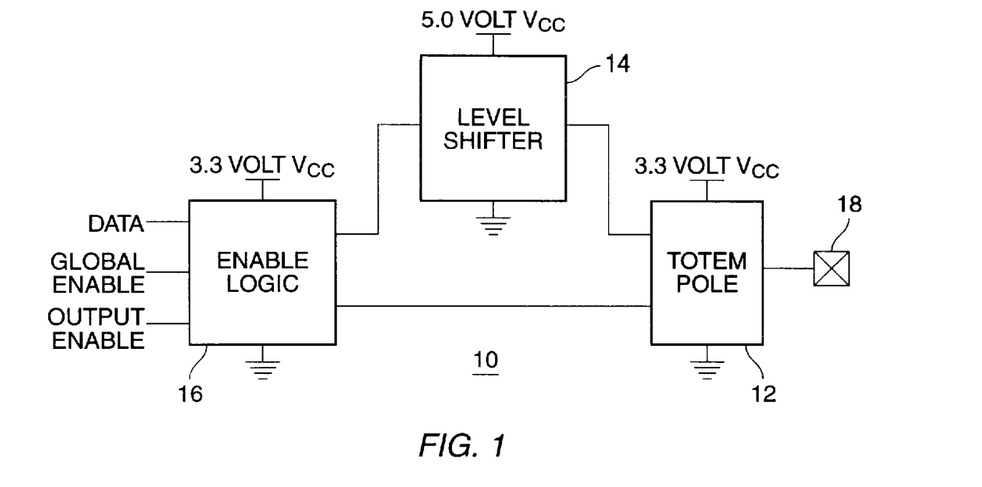
FIG. 1 is a block diagram of the output buffer circuit of the present invention for driving devices from multiple logic families having differing Vcc voltage requirements.

Referring first to FIG. 1 a block diagram is shown of an output buffer circuit 10 of the present invention for driving devices from logic families having a first Vcc which are connected through a common node to devices of logic families having the first Vcc or a Vcc other than the first Vcc. The output buffer circuit 10 includes a totem pole block 12, a level shifter block 14, and an enable logic block 16.

Totem pole block 12 has a first input connected to the level shifter block 14 and a second input connected to the enable logic block 16. The output of the totem pole block 12 is connected to an output pad 18. The Vcc voltage level supplied to the totem pole block 12 is preferably the same as the Vcc voltage level supplied to the integrated circuit for which the output buffer circuit 10 is provided, namely 3.3 volts. The Vcc voltage level supplied to the level shifter block 14 is preferably 5 volts. The Vcc voltage level supplied to the enable logic block 16 is also preferably the same as the Vcc voltage level supplied to the integrated circuit for which the output buffer circuit 10 is provided, namely 3.3 volts. It should be appreciated that the same Vcc voltage level provided to different portions of the invention may be provided by the same Vcc supply or by separate Vcc supplies.

In the preferred embodiments, the Vcc supplied to the enable logic block 16 and the totem pole block 12 will be the same Vcc as supplied to the integrated circuit using the output buffer circuit 10. It should be appreciated however, that the Vcc supplied to enable logic block 16 may be different from the Vcc supplied to totem pole block 12, and that the Vcc supplied to enable logic block 16 and the Vcc supplied to totem pole block 12 need not be the same as the Vcc supplied to the integrated circuit using output buffer circuit 10. The Vcc supplied to the level shifter block 14 is higher than the Vcc supplied to the totem pole block 12. The extent to which the Vcc supplied to the level shifter 14 is higher that that supplied to totem pole block 12 will be discussed in the embodiments below.

The totem pole block 12 includes a pullup transistor connected to 3.3 voltage Vcc and a pulldown transistor connected to ground. The output of the totem pole block 12 will be HIGH when the pullup transistor is turned on, LOW when the pulldown transistor is turned on, and high impedance when both the pullup and pulldown transistors are turned off. The pullup transistor in the totem pole block 12 is turned on and off by a signal from the enable logic 16 through the level shifter block 14 to the first input in the totem pole block 12. The pulldown transistor in the totem pole block 12 is turned on and off by a signal directly from the enable logic 16 to the second input of the totem pole block 12.

As will be explained more fully below, the enable logic drives the output of the totem pole block 12 to either a LOW logic level, a HIGH logic level or a high impedance state in response to input signals to the enable logic block 16. The inputs to the enable logic block 16 are a Data input, a Global enable input and an Output enable input. The Global enable input responds to a global output select signal which is transmitted to each of the output buffer circuits simultaneously, and the Output enable input responds to an individual output buffer select signal. The use of Global enable inputs and Output enable inputs in output buffer circuits is well known to those of ordinary skill in the art.

A HIGH signal presented to both the Global enable and the Output enable in the enable logic block 16 will cause the output of the totem pole block 12 to be HIGH, if the signal to the Data input is HIGH, and will cause it to be LOW, if the signal to Data input is LOW. When a LOW signal is presented to either the Global enable or the Output enable in the enable logic block 16, the output of the totem pole block 12 will be in a high impedance state.

In a first preferred embodiment of the invention, the pullup transistor in the totem pole block 12 is an N-channel MOS transistor, and in a second preferred embodiment of the invention, the pullup transistor in the totem pole block 12 is an P-channel MOS transistor formed in an N-well tied to a Vcc which is higher than the Vcc supplied to the totem pole block 12. In the second preferred embodiment, the Vcc supplied to the N-well is the same Vcc supplied to the level shifter block 14.

Figure 2:
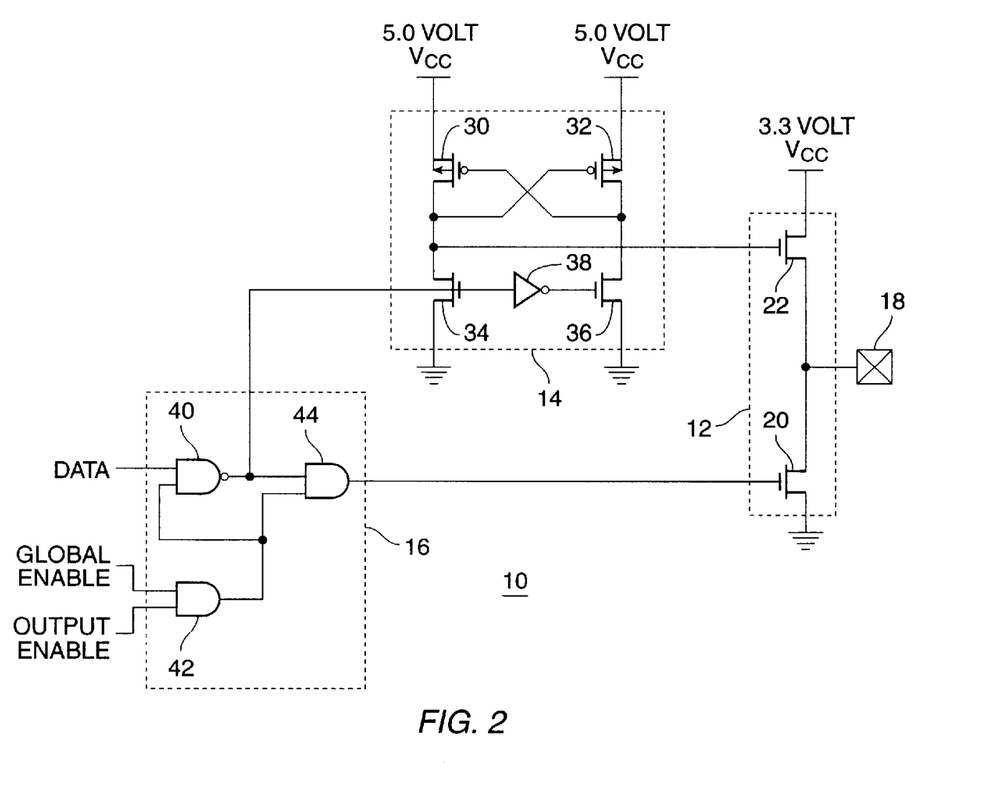
FIG. 2 is a schematic diagram of a first embodiment of an output buffer circuit for driving devices from multiple logic families having differing Vcc voltage requirements.

Referring now to FIG. 2, a schematic diagram of the first embodiment of the output buffer circuit 10 is shown. According to the first embodiment of the present invention, I/O pad 18 is pulled down to a LOW logic level by N-Channel MOS pulldown transistor 20 whose source is connected to ground, and is pulled up to a HIGH logic level by N-Channel MOS source-follower pullup transistor 22 whose drain is connected to a 3.3 volt Vcc. As will be more fully disclosed herein, the gate of N-Channel MOS pulldown transistor 20 is driven by a signal from the enable logic block 16, and the gate of N-Channel MOS source-follower pullup transistor 22 is driven by a signal from the enable logic block 16 through the level shifter block 14.

The level shifter block 14 includes first and second cross-coupled P-Channel MOS transistors 30 and 32 having their sources and the N-well in which the first and second cross-coupled P-Channel MOS transistors 30 and 32 are disposed connected to a 5 volt Vcc. The drain of the first P-Channel MOS transistor 30 is connected to the drain of a first N-Channel MOS transistor 34. The drain of the second P-Channel MOS transistor 32 is connected to the drain of a second N-Channel MOS transistor 36. The gate of the first P-Channel MOS transistor 30 is connected to the common drain connection of the second P-Channel and N-Channel MOS transistors 32 and 36. The gate of the second P-Channel MOS transistor 32 is connected to the common drain connection of the first P-Channel and N-Channel MOS transistors 30 and 34. The node comprising the gate of the second P-Channel MOS transistor 32 and the drains of the first P-Channel and N-Channel MOS transistors 30 and 34 is connected to the gate of the N-Channel MOS source-follower pullup transistor 22 in the totem pole block 12. An inverter 38 is connected between the gate of the first N-Channel MOS transistor 34 and the gate of the second N-Channel MOS transistor 36. The level shifter block 14 is driven by signals from the enable logic 16 to the gate of the first N-Channel MOS transistor 34, and to the gate of the second N-Channel MOS transistor 36 through inverter 38. The operation of the level shifter block 14 will be described below.

Enable logic block 16 forces the output of the totem pole block 12 to either a LOW logic level, a HIGH logic level, or a high impedance state in response to input signals to the enable logic block 16. The inputs to the enable logic block 16 are the Data input, the Global enable input and the Output enable input. In the enable logic block 16, the Data input is a first input of a NAND gate 40, the Global enable input is a first input of a first AND gate 42, and the Output enable input is a second input of the first AND gate 42. The output of the first AND gate 42 is a second input of the NAND gate 40. Those of ordinary skill in the art will realize that in an alternative embodiment the Global enable input may be omitted.

The output of the NAND gate 40 drives the gate of the first N-Channel MOS transistor 34 in the level shifter block 14, and the gate of the second N-Channel MOS transistor 36 in the level shifter block 14 through the inverter 38 connected between the first and second N-channel MOS transistors 34 and 36 in the level shifter block 14. The output of the first AND gate 42 and the output of the NAND gate 40 are also connected to the first and second inputs of a second AND gate 44. The output of the second AND gate 44 drives the gate of the N-Channel MOS pulldown transistor 20 of the totem pole block 12.

A 3.3 volt Vcc is supplied to inverter 38 in the level shifter block 14, NAND gate 40 and first and second AND gates 42 and 44 in the enable logic block 16, and N-Channel MOS source-follower pullup transistor 22 in the totem pole block 12. A 5 volt Vcc is supplied to the sources of first and second P-Channel MOS cross-coupled transistors 30 and 32, and the N-well in which first and second P-Channel MOS cross-coupled transistors 30 and 32 are disposed.

The gate oxides of the first and second P-Channel MOS cross-coupled transistors 30 and 32 have a thickness rated for 5 volt operation. The first and second N-channel MOS transistors 34 and 36 in the level shifter and the N-channel MOS pulldown and pullup transistors 20 and 22 in the totem pole block 12 are in the first embodiment low voltage gate offset CMOS transistors (LGO). The LGO transistors, which will be explained more fully below, differ from conventional low voltage CMOS transistors by having a longer channel under the gate oxide, a lightly doped drain region, and a more heavily doped drain region in the same area as the lightly doped drain region, but offset from the gate. It should also be appreciated that the first and second N-channel MOS transistors 34 and 36 in the level shifter and the N-channel MOS pulldown and pullup transistors 20 and 22 in the totem pole block 12 could also be conventional low voltage MOS transistors as known in the art.

The output of the output buffer circuit 10 depends on the input signals at the inputs to the enable logic block 16. When either of the Global enable or Output enable signals are LOW, the output of the first AND gate 42 is LOW. This causes the output of the NAND gate 40 to be HIGH, and the output of the second AND gate 44 to be LOW. The LOW output of the second AND gate 44 turns off the N-Channel pulldown transistor 20. The HIGH output of the NAND gate 40 turns on the first N-Channel MOS transistor 34 in the level shifter block 14, and turns off the second N-Channel MOS transistor 36 in the level shifter block 14 through the inverter 38.

The turned on first N-Channel MOS transistor 34 pulls its drain down to ground which causes second P-Channel MOS transistor 32 to be turned on because the drain of first N-Channel MOS transistor 34 is connected to the gate of second P-Channel MOS transistor 32 in the cross coupled transistor pair. As a result of being turned on, the drain of second P-Channel MOS transistor 32 is pulled up to 5 volts. The turned off second N-channel MOS transistor 36 allows the first P-Channel MOS transistor 30 in the cross coupled transistor pair to be also be turned off when the 5 volts at the drain of second P-Channel MOS transistor 32 is applied to the gate of first P-Channel MOS transistor 30. Under these conditions, the N-Channel MOS source follower pullup transistor 22 in the totem pole which is connected to the node comprising the gate of the second P-Channel MOS transistor 32 and the drains of the first P-Channel and N-Channel MOS transistors 30 and 34 is also turned off, and the I/O pad 18 is at a high impedance state.

When both of the Global enable and Output enable signals are HIGH, the output of the totem pole block 12 follows the input signal at the Data input. The HIGH signals presented to both the Global enable and Output enable inputs makes the output of the first AND gate 42 HIGH. The HIGH output of the first AND gate 42 causes the outputs of both the NAND gate 40 and the second AND gate 44 to be the complement of the Data input. A LOW output from the second AND gate 44 will turn off the N-channel MOS pulldown transistor 20 in the totem pole block 12, and a LOW output from the NAND gate 40 will turn on the N-channel MOS pullup transistor 22 in the totem pole block 12 through the level shifter 14 to place a HIGH logic level at the output pad 18.

In the level shifter block 14, the LOW output of the NAND gate 40 turns off the first N-Channel MOS transistor 34 in the level shifter block 14, and turns on the second N-Channel MOS transistor 36 in the level shifter block 14 through the inverter 38. The turned on second N-Channel MOS transistor 36 pulls its drain down to ground which causes first P-Channel MOS transistor 30 to be turned on because the drain of second N-Channel MOS transistor 36 is connected to the gate of first P-Channel MOS transistor 30 in the cross coupled transistor pair. As a result of being turned on, the drain of first P-Channel MOS transistor 30 is pulled up to 5 volts. The turned off first N-channel MOS transistor 36 allows the second P-Channel MOS transistor 30 in the cross coupled transistor pair to be also be turned off when the 5 volts at the drain of first P-Channel MOS transistor 30 is applied to the gate of second P-Channel MOS transistor 32. Under these conditions, the N-Channel MOS source follower pullup transistor 22 in the totem pole which is connected to the node comprising the gate of the second P-Channel MOS transistor 32 and the drains of the first P-Channel and N-Channel MOS transistors 30 and 34 is turned on, and the I/O pad 18 is at a HIGH logic level.

A HIGH output from the second AND gate 44 will turn on the N-channel MOS pulldown transistor 20 in the totem pole block 12, and a HIGH output from the NAND gate 40 will turn off the N-channel MOS pullup transistor 22 in the totem pole block 12 through the level shifter block 14, as explained above. This places a LOW logic level at the output pad 18.

As will be readily appreciated by those of ordinary skill in the art from an examination of FIG. 2, the use of N-Channel MOS source-follower pullup transistor 22 as a pullup device allows both 3.3 voltage Vcc devices and 5 voltage Vcc devices to be connected to the I/O pad 18. When the output buffer circuit 10 is in a high impedance state, a 5 voltage signal on I/O pad 18 from another device will not turn on the junction diode of the N-channel pull-up transistor 22 or the N-channel pull-up transistor 22. This keeps the I/O pad 18 from being clamped to the 3.3 voltage Vcc and thereby prevents sinking a great deal of current. The level shifter block 14 which can put a 5 voltage signal at the gate of N-channel MOS pullup transistor 22 whose drain is connected to 3.3 volts ensures a rail-to-rail voltage swing at the output of the totem pole block 12. In addition, the use of an all N-Channel totem pole block 12 provides a high latch-up immunity, and facilitates the use of less expensive non-epitaxial wafers.

It should be appreciated by those of ordinary skill in the art that the gate oxide thicknesses of the first and second P-Channel MOS cross-coupled transistors 30 and 32 are rated for 5 volt operation. Further, the first and second N-channel MOS transistors 34 and 36 in the level shifter block 14, and the N-channel MOS pulldown and pullup transistors 20 and 22 in the totem pole output block 12 are, in the first embodiment, the LGO transistor shown in FIG. 3. It should also be appreciated by those of ordinary skill in the art, that although the problem is presently directed to 5/3.3 volt Vcc hybrid systems, that in the future, further reductions in the operating voltages of integrated circuits will occur, and that the present invention contemplates such changes.

Figure 3:
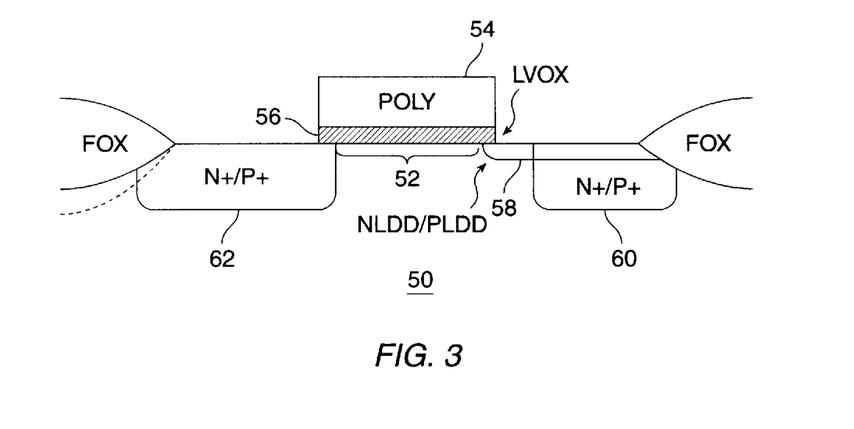
FIG. 3 is cross section of a low voltage gate offset CMOS transistor suitable for use in the present invention.

The LGO transistor 50 is shown in FIG. 3. LGO transistor 50 is a modification of a low voltage CMOS transistor well known to those of ordinary skill in the art. LGO transistor 50 may be either a P-channel or N-channel MOS transistor. The modified features of LGO transistor 50 are a longer channel 52 under the polysilicon gate 54 and gate oxide 56 than a conventional low voltage CMOS transistor, a lightly doped drain region (LDD) 58 abutting a region under a first side of the polysilicon gate 54, and a more heavily doped drain region 60 in the same area as the LDD 58, but offset from the polysilicon gate 54. A second heavily doped source region 62 abuts the region under a second side of the polysilicon gate 54.

The LDD 58 is advantageous because it permits operation of the LGO transistor 50 at a higher voltage than a conventional low voltage CMOS transistor. When the LGO transistor 50 is on, the LDD 58 reduces the lateral electric field under the gate 54 by placing a significant resistance in series with the current flow. The increased channel length 52 also helps in this regard. When the LGO transistor 50 is turned off, the drain breakdown voltage is increased.

The LGO transistor 50 is processed using standard CMOS processing well known to those of ordinary skill in the art. The processing steps to make the LGO transistor 50 are the same as those used to typically make a low voltage CMOS transistor in most fabrication environments. Only the mask for the polysilicon gate 54 and the mask for the highly doped drain regions 60 and 62 need be changed. The change in the mask for the LGO transistor 50 results in a longer channel under the polysilicon gate 54 and the offset for the highly doped source/drain region 60.

The present invention allows a user to connect the I/O pad of an integrated circuit equipped with the present invention to 3.3 volt Vcc CMOS, 3.3 volt Vcc TTL, or 5 volt Vcc TTL device busses and inputs on a pad-by-pad basis. It is more efficient than prior Vcc block-by-block selectable approaches. Those of ordinary skill in the art will recognize that generally the present invention is applicable to any of several logic families operating at different voltages. It can be appreciated that at some point in the future another change in Vcc may occur, and the present invention contemplates that change.

Figure 4:
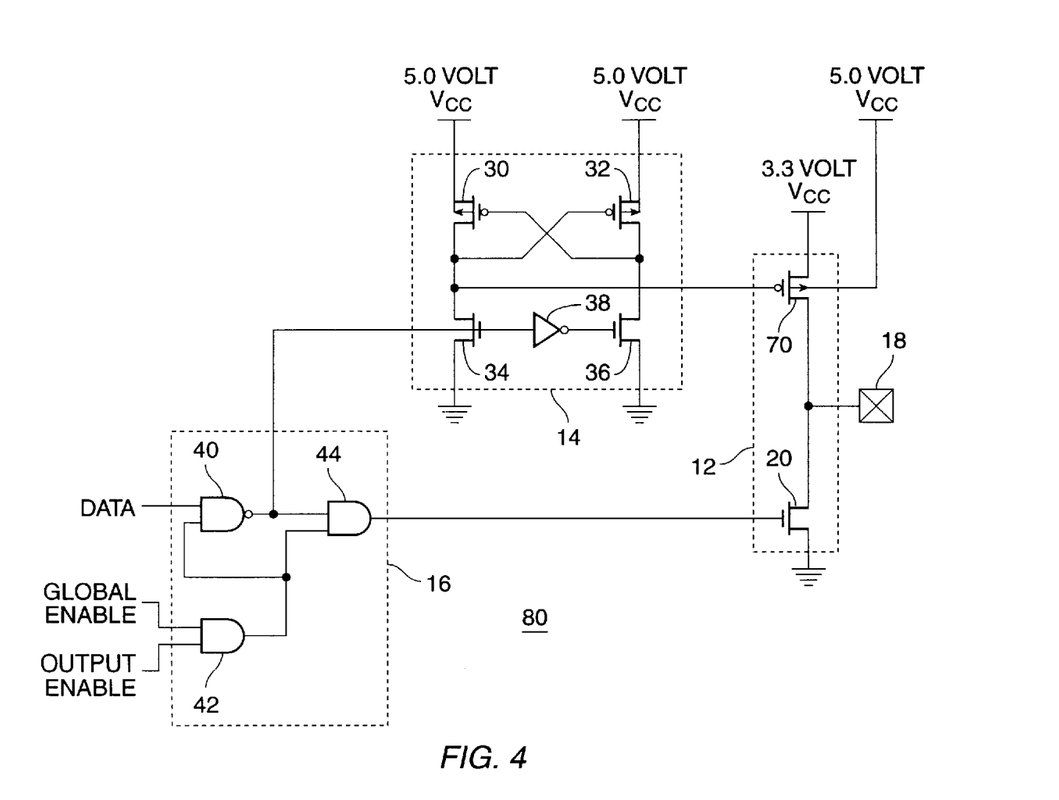
FIG. 4 is a schematic diagram of a second embodiment of an output buffer circuit for driving devices from multiple logic families having differing Vcc voltage requirements.

FIG. 4 is a schematic diagram of a second embodiment of the present invention of an output buffer circuit 80 for driving devices from multiple logic families having differing Vcc voltage requirements. The embodiment depicted in FIG. 4 differs somewhat from the embodiment of FIG. 2. To avoid unnecessary duplication of reference numerals, elements in the embodiment of FIG. 4 which correspond to elements of FIG. 2 are given the same reference numerals in both figures.

Referring now to FIG. 4, a schematic diagram of a second embodiment of the output buffer circuit 80 is shown.

According to the second embodiment of the present invention, IO pad 18 is pulled down to the LOW logic level by N-Channel MOS pulldown transistor 20 whose source is connected to ground, and is pulled up to the HIGH logic level by P-Channel MOS pullup transistor 70 whose source is connected to a 3.3 volt Vcc. The P-Channel MOS pullup transistor 70 is disposed in an N-well which is tied to a 5 volt Vcc. As will be more fully disclosed herein, the gate of N-Channel MOS pulldown transistor 20 is driven by a signal from the enable logic block 16, and the gate of P-Channel MOS pullup transistor 70 is driven by a signal from the enable logic block 16 through the level shifter block 14.

The level shifter block 14 includes first and second cross-coupled P-Channel MOS transistors 30 and 32 having their sources and the N-well in which the first and second cross-coupled P-Channel MOS transistors 30 and 32 are disposed connected to a 5 volt Vcc. The drain of the first P-Channel MOS transistor 30 is connected to the drain of a first N-Channel MOS transistor 34. The drain of the second P-Channel MOS transistor 32 is connected to the drain of a second N-Channel MOS transistor 36. The gate of the first P-Channel MOS transistor 30 is connected to the common drain connection of the second P-Channel and N-Channel MOS transistors 32 and 36. The gate of the second P-Channel MOS transistor 32 is connected to the common drain connection of the first P-Channel and N-Channel MOS transistors 30 and 34. The node comprising the gate of the first P-Channel MOS transistor 30 and the drains of the second P-Channel and N-Channel MOS transistors 32 and 36 is connected to the gate of the P-Channel MOS source-follower pullup transistor 70 in the totem pole block 12. An inverter 38 is connected between the gate of the first N-Channel MOS transistor 34 and the gate of the second N-Channel MOS transistor 36. The level shifter block 14 is driven by signals from the enable logic 16 to the gate of the first N-Channel MOS transistor 34, and to the gate of the second N-Channel MOS transistor 36 through inverter 38.

Enable logic block 16 forces the output of the totem pole block 12 to either a LOW logic level, a HIGH logic level or a high impedance state in response to input signals to the enable logic block 16. The inputs to the enable logic block 16 are a Data input, a Global enable input and an Output enable input. The Global enable input responds to a global output select signal which is transmitted to each of the output buffer circuits simultaneously, and the Output enable input responds to an individual output select signal. The use of Global enable inputs and Output enable inputs in output buffer circuits is well known to those of ordinary skill in the art. In the enable logic block 16, the Data input is a first input of a NAND gate 40, the Global enable input is a first input of a first AND gate 42, and the Output enable input is a second input of the first AND gate 42. The output of the first AND gate 42 is the second input of the NAND gate 40.

The output of the NAND gate 40 drives the gate of the first N-Channel MOS transistor 34 in the level shifter block 14, and the gate of the second N-Channel MOS transistor 36 in the level shifter block 14 through the inverter 38 connected between the first and second N-channel MOS transistors 34 and 36 in the level shifter block 14. The output of the first AND gate 42 and the output of the NAND gate 40 are also connected to the first and second inputs of a second AND gate 44. The output of the second AND gate 44 drives the gate of the N-Channel MOS pulldown transistor 20 of the totem pole 12.

A 3.3 volt Vcc is supplied to inverter 38 in the level shifter block 14, NAND gate 40 and first and second AND gates 42 and 44 in the enable logic block 16, and P-Channel MOS pullup transistor 70 in the totem pole block 12. A 5 volt Vcc is supplied to the sources of the first and second P-Channel MOS cross-coupled transistors 30 and 32, and the N-well in which the first and second P-Channel MOS cross-coupled transistors 30 and 32, and the P-Channel MOS pullup transistor 70 are disposed.

The gate oxides of the first and second P-Channel MOS cross-coupled transistors 30 and 32 have a thickness rated for 5 volt Vcc. In the second preferred embodiment, first and second N-channel MOS transistors 34 and 36 in the level shifter block 14 and N-channel MOS pulldown transistor 20 and P-Channel MOS pullup transistor 70 in the totem pole block 12 are LGO transistors, as explained above.

The output of the output buffer circuit 80 depends on the input signals at the inputs to the enable logic block 16. When either of the Global enable or Output enable signals are LOW, the output of the first AND gate 42 is LOW. This causes the output of the NAND gate 40 to be HIGH, and the output of the second AND gate 44 to be LOW. The LOW output of the second AND gate 44 turns off the N-Channel pulldown transistor 20. The HIGH output of the NAND gate 40 turns on the first N-Channel MOS transistor 34 in the level shifter block 14, and turns off the second N-Channel MOS transistor 36 in the level shifter block 14 through the inverter 38.

The turned on first N-Channel MOS transistor 34 pulls its drain down to ground which causes second P-Channel MOS transistor 32 to be turned on because the drain of first N-Channel MOS transistor 34 is connected to the gate of second P-Channel MOS transistor 32 in the cross coupled transistor pair. As a result of being turned on, the drain of second P-Channel MOS transistor 32 is pulled up to 5 volts. The turned off second N-channel MOS transistor 36 allows the first P-Channel MOS transistor 30 in the cross coupled transistor pair to be also be turned off when the 5 volts at the drain of second P-Channel MOS transistor 32 is applied to the gate of first P-Channel MOS transistor 30. Under these conditions, the P-Channel MOS pullup transistor 70 which is connected to the node in the level shifter block 14 comprising the gate of the first P-Channel MOS transistor 30 and the drains of the second P-Channel and N-Channel MOS transistors 32 and 36 is also turned off, and the output pad 18 is at a high impedance state.

When both of the Global enable and Output enable signals are HIGH, the output of the totem pole block 12 follows the input signal at the Data input. The HIGH signals at both the Global enable and Output enable inputs make the output of the first AND gate 42 HIGH. The HIGH output of the first AND gate 42 causes the outputs of both the NAND gate 40 and the second AND gate 44 to be the complement of the Data input.

A LOW output from the second AND gate 44 will turn off the N-channel MOS pulldown transistor 20 in the totem pole block 12, and a LOW output from the NAND gate 40 will turn on the P-channel MOS pullup transistor 70 in the totem pole block 12 through the level shifter 14 to place a HIGH logic level at the output pad 18.

In the level shifter block 14, the LOW output of the NAND gate 40 turns off the first N-Channel MOS transistor 34 in the level shifter block 14, and turns on the second N-Channel MOS transistor 36 in the level shifter block 14 through the inverter 38. The turned on second N-Channel MOS transistor 36 pulls its drain down to ground which causes first P-Channel MOS transistor 30 to be turned on because the drain of second N-Channel MOS transistor 36 is connected to the gate of first P-Channel MOS transistor 30 in the cross coupled transistor pair. As a result of being turned on, the drain of first P-Channel MOS transistor 30 is pulled up to 5 volts. The turned off first N-channel MOS transistor 34 allows the second P-Channel MOS transistor 32 in the cross coupled transistor pair to also be turned off when the 5 volts at the drain of first P-Channel MOS transistor 30 is applied to the gate of second P-Channel MOS transistor 32. Under these conditions, the P-Channel MOS source follower pullup transistor 70 in the totem pole, which is connected to the node in the level shifter block 14 comprising the gate of the first P-Channel MOS transistor 30 and the drains of the second P-Channel and N-Channel MOS transistors 32 and 36, is turned on, and the I/O pad 18 is at a HIGH logic level.

A HIGH output from the second AND gate 44 will turn on the N-channel MOS pulldown transistor 20 in the totem pole block 12, and a HIGH output from the NAND gate 40 will turn off the P-channel MOS pullup transistor 70 in the totem pole block 12 through the level shifter block 14, as explained above. This places a LOW logic level at the output pad 18.

As will be readily appreciated by those of ordinary skill in the art from an examination of FIG. 4, the use of P-Channel MOS pullup transistor 70 disposed in an N-well tied to a 5 volt Vcc as a pullup device allows both 3.3 volt and 5 volt devices to be connected to the output pad 18. With the N-well tied to a 5 volt Vcc, there will be no forward bias of the junction diode in the P-Channel MOS pullup transistor 70 when the P-type drain region of the P-Channel MOS pullup transistor 70 which is connected to output pad 18 is driven to 5 volts by another device. Further, the P-Channel MOS pullup transistor 70 will not turn on when the output pad is driven to 5 volts, because the voltage at the pad is not higher than the voltage supplied to the gate of the P-Channel MOS pullup transistor 70 by the level shifter block 14 to turn off the P-Channel MOS pullup transistor 70.

It should be appreciated by those of ordinary skill in the art that the gate oxide thicknesses of the first and second P-Channel MOS cross-coupled transistors 30 and 32 are rated for 5 volt Vcc. Further, the first and second N-channel MOS transistors 34 and 36 in the level shifter block 14, and the N-channel MOS pulldown and the P-channel MOS pullup transistors 20 and 70 in the totem pole output block 12 are, in the second embodiment, the LGO transistor shown in FIG. 3. It should also be appreciated that the first and second N-channel MOS transistors 34 and 36 in the level shifter block 14, and the N-channel MOS pulldown and the P-channel MOS pullup transistors 20 and 70 in the totem pole output block 12 could also be conventional low voltage MOS transistors as is known in the art.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An output buffer circuit for an integrated circuit having a first Vcc capable of interfacing with devices from multiple logic families having a second Vcc voltage requirements, said output buffer circuit including:

first and second P-Channel MOS transistors each having a source connected to a third Vcc, a drain and a gate, said gate of said first P-Channel MOS transistor connected to said drain of said second P-Channel MOS transistor and said gate of said second P-Channel MOS transistor connected to said drain of said first P-Channel MOS transistor to form a cross-coupled transistor pair;

first and second N-Channel MOS transistors each having a source connected to ground potential, a drain and a gate, said drain of said first N-Channel MOS transistor connected to the drain of said first P-Channel MOS transistor to form a first node and said drain of said second N-Channel MOS transistor connected to the drain of said second P-Channel MOS transistor to form a second node;

an inverter having an input connected to said gate of said first N-Channel transistor and an output connected to said gate of said second N-Channel transistor;

an N-Channel MOS pullup transistor having a drain connected to a fourth Vcc, a source, and a gate connected to said first node;

an N-Channel MOS pulldown transistor having a source connected to ground potential, a drain connected to said source of said N-Channel pullup transistor to form an output node, and a gate;

a NAND gate having a first input connected to a data input node and a second input connected to an output enable signal node, and an output connected to said input of said inverter; and an AND gate having a first input connected to said output of said NAND gate, a second input connected to said output enable signal node, and an output connected to said gate of said N-Channel MOS pulldown transistor.

2. An output buffer circuit for an integrated circuit having a first Vcc capable of interfacing with devices from multiple logic families having a second Vcc voltage requirements, said output buffer circuit including:

first and second P-Channel MOS transistors each having a source connected to a third Vcc, a drain and a gate, said gate of said first P-Channel MOS transistor connected to said drain of said second P-Channel MOS transistor and said gate of said second P-Channel MOS transistor connected to said drain of said first P-Channel MOS transistor to form a cross-coupled transistor pair;

first and second N-Channel MOS transistors each having a source connected to ground potential, a drain and a gate, said drain of said first N-Channel MOS transistor connected to the drain of said first P-Channel MOS transistor to form a first node and said drain of said second N-Channel MOS transistor connected to the drain of said second P-Channel MOS transistor to form a second node;

an inverter having an input connected to said gate of said first N-Channel transistor and an output connected to said gate of said second N-Channel transistor;

an N-Channel MOS pullup transistor having a drain connected to a fourth Vcc, a source, and a gate connected to said first node;

an N-Channel MOS pulldown transistor having a source connected to ground potential, a drain connected to said source of said N-Channel pullup transistor to form an output node, and a gate;

a NAND gate having a first input connected to a data input node, a second input, and an output connected to said input of said inverter;

a first AND gate having a first input connected to a global enable signal node, a second input connected to an output enable signal node, and an output connected to said second input of said NAND gate;

and a second AND gate having a first input connected to said output of said NAND gate, a second input connected said output of said first AND gate and an output connected to said N-Channel pulldown transistor.

3. An output buffer circuit for an integrated circuit having a first Vcc capable of interfacing with devices from multiple logic families having a second Vcc voltage requirements, said output buffer circuit including:

first and second P-Channel MOS transistors each having a source connected to a third Vcc, a drain and a gate, said gate of said first P-Channel MOS transistor connected to said drain of said second P-Channel MOS transistor and said gate of said second P-Channel MOS transistor connected to said drain of said first P-Channel MOS transistor to form a cross-coupled transistor pair;

first and second N-Channel MOS transistors each having a source connected to ground potential, a drain and a gate, said drain of said first N-Channel MOS transistor connected to the drain of said first P-Channel MOS transistor to form a first node and said drain of said second N-Channel MOS transistor connected to the drain of said second P-Channel MOS transistor to form a second node;

an inverter having an input connected to said gate of said first N-Channel transistor and an output connected to said gate of said second N-Channel transistor;

an P-Channel MOS pullup transistor having a source connected to a fourth Vcc, a drain, and a gate connected to said second node, said P-Channel MOS pullup transistor disposed in an N-Well which is tied to a fifth Vcc;

an N-Channel MOS pulldown transistor having a source connected to ground potential, a drain connected to said drain of said P-Channel pullup transistor to form an output node, and a gate;

a NAND gate having a first input connected to a data input node and a second input connected to an enable signal node, and an output connected to said input of said inverter; and an AND gate having a first input connected to said output of said NAND gate, a second input connected to said enable signal node, and an output connected to said gate of said N-Channel MOS pulldown transistor.

4. An output buffer circuit for an integrated circuit having a first Vcc capable of interfacing with devices from multiple logic families having a second Vcc voltage requirement, said output buffer circuit including:

an enable logic circuit comprising:
  a NAND gate having a data input, an output enable input, and a output; and
  an AND gate having a first input connected to said output of said NAND gate, a second input connected to said output enable input and an output;

a level shifter having an input, said input connected to said output of said NAND gate, and an output; and a totem pole output having a first input connected to said output of said level shifter, and a second input connected to said output of said AND gate, and an output connected to an output pad.

5. An output buffer circuit for an integrated circuit having a first Vcc capable of interfacing with devices from multiple logic families having a second Vcc voltage requirement, said output buffer circuit including:

an enable logic circuit comprising:
a NAND gate having a first data input, a second input, and an output;
a first AND gate having a global enable input, an output enable input and an output connected to second input of said NAND gate; and
a second AND gate having a first input connected to said output of said NAND gate, a second input connected to said output of said first AND gate and an output;

a level shifter having an input, said input connected to said output of said NAND gate, and an output; and a totem pole output having a first input connected to said output of said level shifter, and a second input connected to said output of said AND gate, and an output connected to an output pad.

6. An output buffer circuit for an integrated circuit having a first Vcc capable of interfacing with devices from multiple logic families having a second Vcc voltage requirements, said output buffer circuit including:

first and second P-Channel MOS transistors each having a source connected to a third Vcc, a drain and a gate, said gate of said first P-Channel MOS transistor connected to said drain of said second P-Channel MOS transistor and said gate of said second P-Channel MOS transistor connected to said drain of said first P-Channel MOS transistor to form a cross-coupled transistor pair;

first and second N-Channel MOS transistors each having a source connected to ground potential, a drain and a gate, said drain of said first N-Channel MOS transistor connected to the drain of said first P-Channel MOS transistor to form a first node and said drain of said second N-Channel MOS transistor connected to the drain of said second P-Channel MOS transistor to form a second node;

an inverter having an input connected to said gate of said first N-Channel transistor and an output connected to said gate of said second N-channel transistor;

an N-Channel MOS pullup transistor having a drain connected to a fourth Vcc, a source, and a gate connected to said first node;

an N-Channel MOS pulldown transistor having a source connected to ground potential, a drain connected to said source of said N-Channel pullup transistor to form an output node, and a gate;

a NAND gate having a first input connected to a data input node and a second input connected to an output enable signal node, and an output connected to said input of said inverter; and an AND gate having a first input connected to said output of said NAND gate, a second input connected to said output enable signal node, and an output connected to said gate of N-Channel MOS pulldown transistor.

7. An output buffer circuit for an integrated circuit having a first Vcc capable of interfacing with devices from multiple logic families having a second Vcc voltage requirements, said output buffer circuit including:

first and second P-Channel MOS transistors each having a source connected to a third Vcc, a drain and a gate, said gate of said first P-Channel MOS transistor connected to said drain of said second P-Channel MOS transistor and said gate of said second P-Channel MOS transistor connected to said drain of said first P-Channel MOS transistor to form a cross-coupled transistor pair;

first and second N-Channel MOS transistors each having a source connected to ground potential, a drain and a gate, said drain of said first N-Channel MOS transistor connected to the drain of said first P-Channel MOS transistor to form a first node and said drain of said second N-Channel MOS transistor connected to the drain of said second P-Channel MOS transistor to form a second node;

an inverter having an input connected to said gate of said first N-Channel transistor and an output connected to said gate of said second N-channel transistor;

an N-Channel MOS pullup transistor having a drain connected to a fourth Vcc, a source, and a gate connected to said first node;

an N-Channel MOS pulldown transistor having a source connected to ground potential, a drain connected to said source of said N-Channel pullup transistor to form an output node, and a gate;

a NAND gate having a first input connected to a data input node, a second input, and an output connected to said input of said inverter;

a first AND gate having a first input connected to a global enable signal node, a second input connected to an output enable signal node, and an output connected to said second input of said NAND gate; and a second AND gate having a first input connected to said output of said NAND gate, a second input connected said output of said first AND gate and an output connected to said N-Channel pulldown transistor.

8. An output buffer circuit for an integrated circuit having a first Vcc capable of interfacing with devices from multiple logic families having a second Vcc voltage requirements, said output buffer circuit including:

first and second P-Channel MOS transistors each having a source connected to a third Vcc, a drain and a gate, said gate of said first P-Channel MOS transistor connected to said drain of said second P-Channel MOS transistor and said gate of said second P-Channel MOS transistor connected to said drain of said first P-Channel MOS transistor to form a cross-coupled transistor pair;

first and second N-Channel MOS transistors each having a source connected to ground potential, a drain and a gate, said drain of said first N-Channel MOS transistor connected to the drain of said first P-Channel MOS transistor to form a first node and said drain of said second N-Channel MOS transistor connected to the drain of said second P-Channel MOS transistor to form a second node;

an inverter having an input connected to said gate of said first N-Channel transistor and an output connected to said gate of said second N-channel transistor;

an P-Channel MOS pullup transistor having a source connected to a fourth Vcc, a drain, and a gate connected to said second node, said P-Channel MOS pullup transistor disposed in an N-well which is tied to a fifth Vcc;

an N-Channel MOS pulldown transistor having a source connected to ground potential, a drain connected to said drain of said P-Channel pullup transistor to form an output node, and a gate;

a NAND gate having a first input connected to a data input node and a second input connected to an enable signal node, and an output connected to said input of said inverter; and an AND gate having a first input connected to said output of said NAND gate, a second input connected to said enable signal node, and an output connected to said gate of said N-Channel MOS pulldown transistor.

* * * * *